US012611875B2

(12) United States Patent
Liu et al.

(10) Patent No.: US 12,611,875 B2
(45) Date of Patent: Apr. 28, 2026

(54) HEATING DEVICE DRIVEN BY A THIN-FILM TRANSISTOR

(71) Applicant: InnoLux Corporation, Miao-Li County (TW)

(72) Inventors: Yu-Tsung Liu, Miao-Li County (TW); Cheng-Hsueh Hsieh, Miao-Li County (TW); Wei-Lin Wan, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 690 days.

(21) Appl. No.: 17/818,091

(22) Filed: Aug. 8, 2022

(65) Prior Publication Data
US 2023/0084746 A1      Mar. 16, 2023

(30) Foreign Application Priority Data
Sep. 14, 2021    (CN) .......................... 202111073104.1

(51) Int. Cl.
| | |
|---|---|
| *B41J 11/00* | (2006.01) |
| *H10D 1/47* | (2025.01) |
| *H10D 30/01* | (2025.01) |
| *H10D 30/67* | (2025.01) |

(52) U.S. Cl.
CPC ............ *B41J 11/0024* (2021.01); *H10D 1/47* (2025.01); *H10D 30/031* (2025.01); *H10D 30/67* (2025.01)

(58) Field of Classification Search
CPC .... B41J 11/0024; B41J 2/1603; B41J 2/1631; B41J 2/1632; B41J 2/14072; B41J 2/14129; B41J 2/1626; B41J 2202/13; B41J 2202/18; H10D 1/47; H10D 30/031; H10D 30/67
See application file for complete search history.

(56) References Cited

U.S. PATENT DOCUMENTS

| | | |
|---|---|---|
| 9,202,895 B2 | 12/2015 | Shimoda et al. |
| 2006/0049134 A1 | 3/2006 | Miyamoto |
| 2007/0153075 A1 | 7/2007 | Lee |

(Continued)

FOREIGN PATENT DOCUMENTS

| | | |
|---|---|---|
| CN | 101007463 A | 8/2007 |
| CN | 105895661 A | 8/2016 |

(Continued)

OTHER PUBLICATIONS

Chinese language office action dated Dec. 6, 2023, issued in application No. TW 111123017.

(Continued)

*Primary Examiner* — William B Partridge
*Assistant Examiner* — Chevy J Boegel
(74) *Attorney, Agent, or Firm* — McClure, Qualey & Rodack, LLP

(57) ABSTRACT
A heating device is provided. The heating device includes a substrate, a thin-film transistor disposed on the substrate, a heater disposed on the substrate, and a bridging component. The thin-film transistor includes a gate, a semiconductor layer, a source, and a drain. The bridging component is electrically connected to the heater and either the source or the drain. A method for fabricating the heating device is also provided.

10 Claims, 16 Drawing Sheets

(56)              References Cited

U.S. PATENT DOCUMENTS

| 2007/0171261 | A1  | 7/2007  | Kim et al. |
| 2016/0046127 | A1* | 2/2016  | Mori .................... B41J 2/14129 |
|              |     |         | 438/21 |
| 2017/0246866 | A1  | 8/2017  | Ge |
| 2019/0363254 | A1  | 11/2019 | Hiruoka |
| 2021/0221135 | A1* | 7/2021  | Lan ..................... B41J 2/14112 |

FOREIGN PATENT DOCUMENTS

| CN | 110494226 | A | 11/2019 |
| JP | 2009544489 | A | 12/2009 |
| TW | 201208080 | A | 2/2012 |
| TW | 201514022 | A | 4/2015 |

OTHER PUBLICATIONS

Chinese language office action dated Nov. 26, 2025, issued in application No. TW 113129845.

* cited by examiner

HEATING DEVICE DRIVEN BY A THIN-FILM TRANSISTOR

CROSS REFERENCE TO RELATED APPLICATIONS

This application claims priority of China Patent Application No. 202111073104.1, filed on Sep. 14, 2021, the entirety of which is incorporated by reference herein.

BACKGROUND

Technical Field

The present disclosure relates to a heating device, and in particular it relates to a heating device driven by a thin-film transistor.

Description of the Related Art

At present, heating devices are fabricated on a silicon substrate using an IC process. Due to the limited wafer size, the fabrication of a heating device with a large area requires a splicing method. Small heating chips may be assembled into larger heating modules using an interval alignment and correction method. However, the splicing method increases the cost of production and makes mass-production impossible.

SUMMARY

In accordance with one embodiment of the present disclosure, a heating device is provided. The heating device includes a substrate, a thin-film transistor, a heater and a bridging component. The thin-film transistor is disposed on the substrate and includes a gate, a semiconductor layer, a source and a drain. The heater is disposed on the substrate. The bridging component is electrically connected to the heater and either the source or the drain.

In accordance with one embodiment of the present disclosure, a method for fabricating a heating device is provided. The fabrication method includes providing a substrate; forming a semiconductor layer on the substrate; forming a gate on the semiconductor layer; forming a source and a drain on the gate; forming a heater on the substrate; and forming a bridging component on the substrate. The bridging component is electrically connected to the heater and either the source or the drain.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
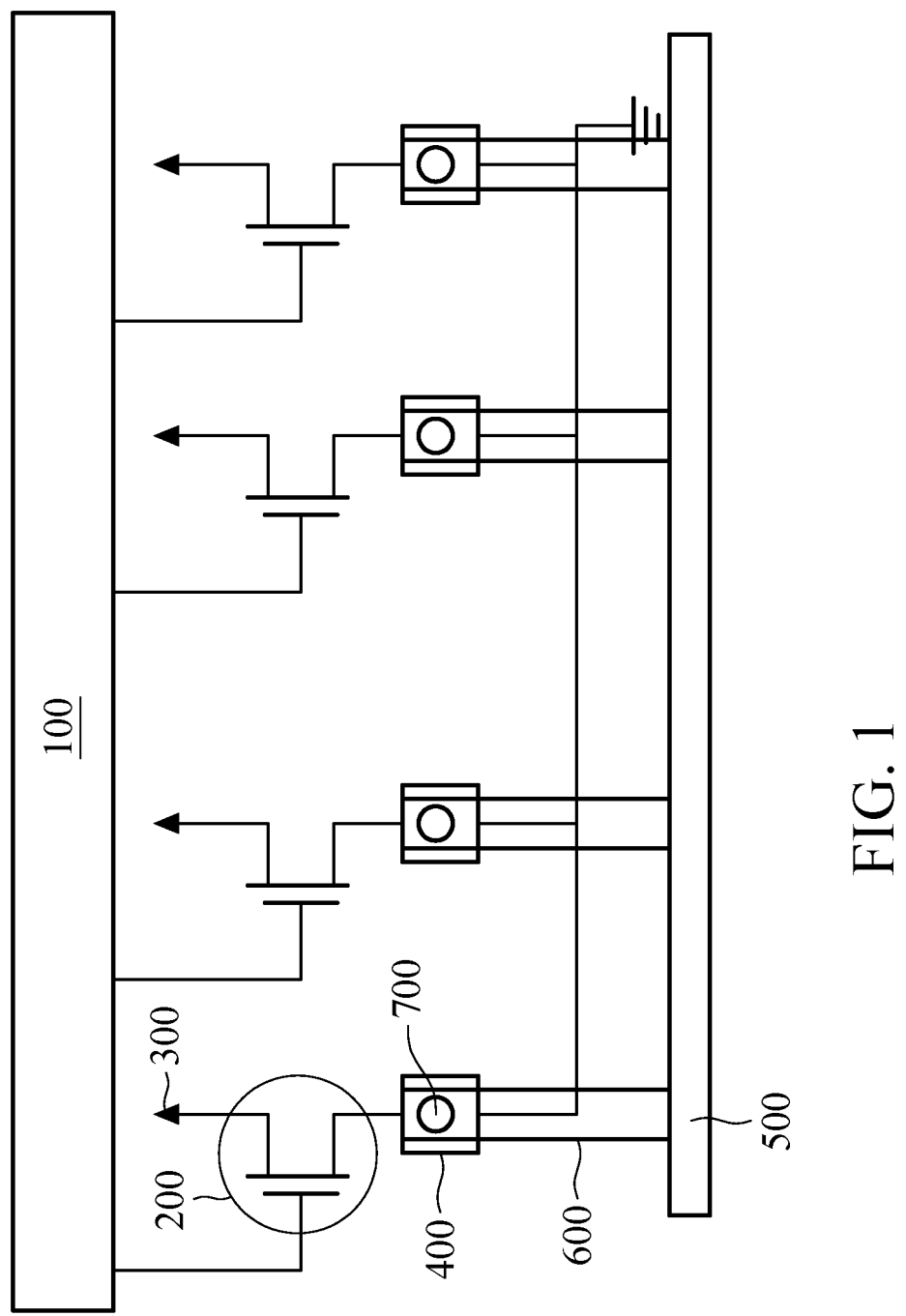
FIG. 1 shows a circuit diagram of a heating device in accordance with one embodiment of the present disclosure.

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned to different directions (such as rotated 45 degrees or other directions), the spatially related adjectives used in it will also be interpreted according to the turned position. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer. In some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Herein, the terms "about", "around" and "substantially" typically mean a value is in a range of +/−15% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms "first", "second", "third", etc. may be used herein to describe various elements, components, regions, layers, portions and/ or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined. The heating device of the present disclosure may include, but is not limited to, a thermal inkjet photoprint device. The present disclosure can be applied to any device that needs to heat an object.

Referring to FIG. 1, in accordance with one embodiment of the present disclosure, a circuit diagram of a heating device 10 is provided to illustrate the operation of the heating device 10.

As shown in FIG. 1, the heating device 10 includes a driving circuit 100, a plurality of thin-film transistors 200, an external power supply circuit 300 and a heater 400. The driving circuit 100 is electrically connected to the plurality of thin-film transistors 200 to control the turn-on and turn-off of the thin-film transistors 200. One end of the thin-film transistor 200 is connected to the external power supply circuit 300, and another end is connected to the heater 400. The end of the heater 400 that is not connected to the thin-film transistor is connected to a common voltage source. Ink is introduced from an ink inlet 500 and filled in a chamber (not shown) through a channel 600. When the driving circuit 100 turns on the thin-film transistor 200, the external power supply circuit 300 provides a voltage so that the current reaches the heater 400 to start heating the ink droplets. After the ink droplets are heated and expanded, they are ejected from the nozzle 700 onto the paper to be printed.

Figure 2:
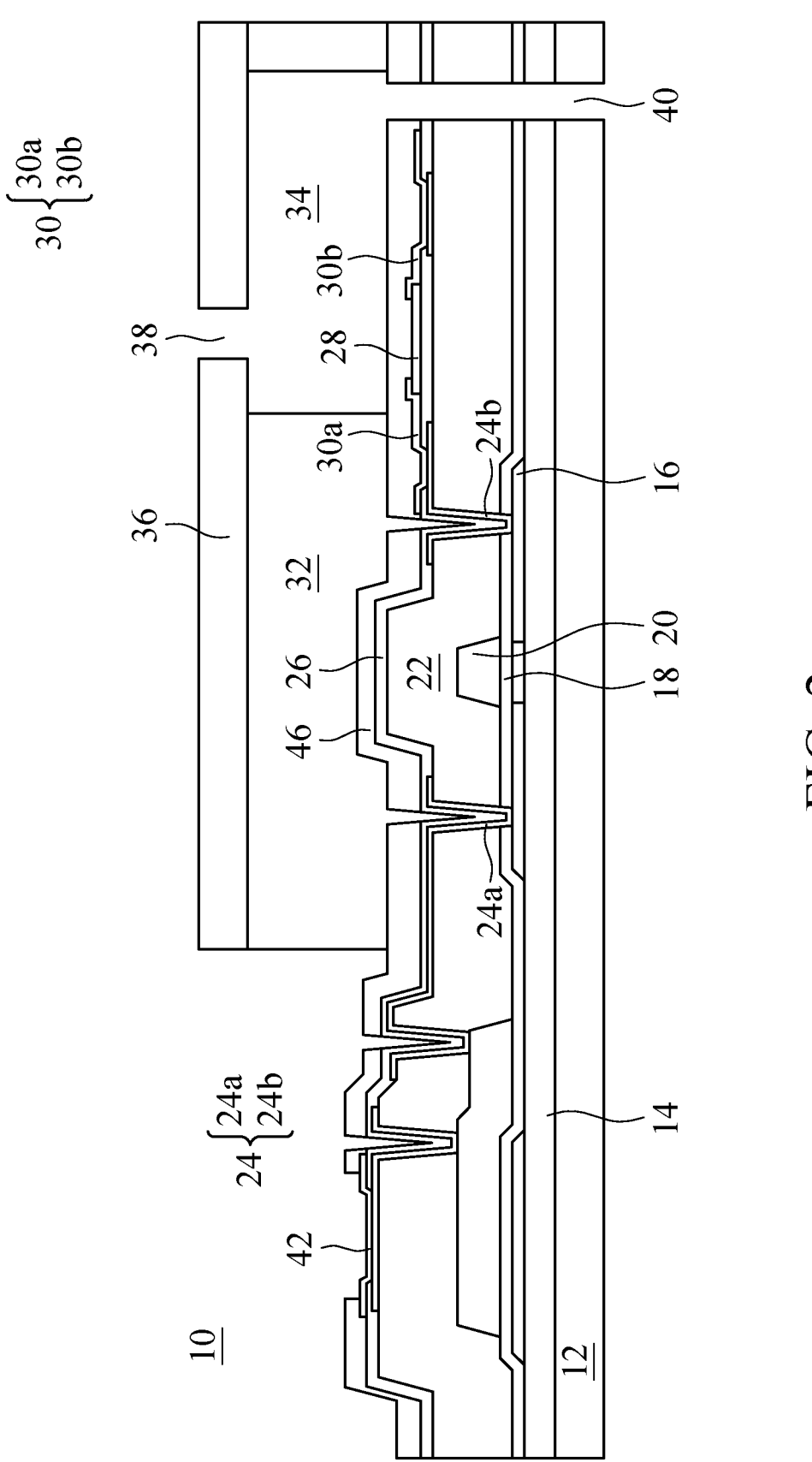
FIG. 2 shows a cross-sectional view of a heating device in accordance with one embodiment of the present disclosure.

Referring to FIG. 2, in accordance with one embodiment of the present disclosure, a heating device 10 is provided. FIG. 2 is a cross-sectional view of the heating device 10.

As shown in FIG. 2, the heating device 10 includes a substrate 12, a buffer layer 14, a semiconductor layer 16, a first insulating layer 18, a first metal layer 20, a second insulating layer 22, a second metal layer 24, a third insulating layer 26, a heater 28, a third metal layer 30, a barrier layer 32 a chamber 34, a nozzle plate 36, a nozzle 38, an ink inlet 40 and a bonding pad 42. The buffer layer 14 is disposed on the substrate 12. The semiconductor layer 16 is disposed on the buffer layer 14. The first insulating layer 18 is disposed on the buffer layer 14 and covers the semiconductor layer 16. The first metal layer 20 is disposed on the first insulating layer 18 (i.e. the first insulating layer 18 is disposed between the semiconductor layer 16 and the first metal layer 20). The second insulating layer 22 is disposed on the first insulating layer 18 and covers the first metal layer 20. The second metal layer 24 is disposed on the first insulating layer 18 and the second insulating layer 22 (i.e. the second insulating layer 22 is disposed between the first metal layer 20 and the second metal layer 24), and electrically connected to the semiconductor layer 16 through the through holes of the first insulating layer 18 and the second insulating layer 22. The third insulating layer 26 is disposed on the second insulating layer 22 and covers the second metal layer 24. The heater 28 is disposed on the third insulating layer 26. The third metal layer 30 is disposed on the third insulating layer 26, and electrically connected to the second metal layer 24 and the heater 28. The fourth insulating layer 46 is disposed on the third insulating layer 26 and covers the heater 28 and the third metal layer 30. The barrier layer 32 is disposed on the fourth insulating layer 46. The chamber 34 is surrounded by the barrier layer 32. The nozzle plate 36 is disposed on the barrier layer 32. The opening in the nozzle plate 36 forms the nozzle 38. The ink inlet 40 is formed on the surface of the substrate 12 and penetrates through the buffer layer 14, the first insulating layer 18, the second insulating layer 22, the third insulating layer 26 and the fourth insulating layer 46 to connect to the chamber 34. The bonding pad 42 is disposed on the second metal layer 24 and connects to an external circuit (for example, a flexible printed circuit (FPC)) (not shown).

In some embodiments, the substrate 12 may include a rigid substrate, such as a glass substrate, but the present disclosure is not limited thereto. In some embodiments, the substrate 12 may include a flexible substrate, such as a polyimide (PI) substrate, but the present disclosure is not limited thereto. The size limitation of silicon wafers can be overcome if the glass substrate is used.

In some embodiments, the buffer layer 14, the first insulating layer 18, the second insulating layer 22, the third insulating layer 26 and the fourth insulating layer 46 may include organic materials or inorganic materials, for example, silicon oxide, silicon nitride, silicon oxynitride or a combination thereof, but the present disclosure is not limited thereto.

In some embodiments, the semiconductor layer 16 may include amorphous silicon, polysilicon or metal oxides. In some embodiments, the first metal layer 20 and the second metal layer 24 may include molybdenum, aluminum, copper, titanium or a combination thereof, such as molybdenum/ aluminum/molybdenum, titanium/aluminum/titanium or titanium/aluminum/molybdenum, but the present disclosure is not limited thereto. Other suitable conductive materials are also applicable to the present disclosure. In FIG. 2, the first metal layer 20 (a gate), the semiconductor layer 16 (an active layer) and the second metal layer 24 (a source 24a and a drain 24b) constitute a thin-film transistor (TFT).

In some embodiments, the heater 28 may include metals, metal alloys, metal oxides or a combination thereof. The metal may include Ta, W, Cr, Mo, Ti, Zr or Hf, but the present disclosure is not limited thereto. In some embodiments, the metal-oxide material used to fabricate the heater 28 may include indium tin oxide (ITO), but the present disclosure is not limited thereto. Since metal oxides (e.g., ITO) have high resistance and can have stable resistance after high-temperature heat treatment, they are quite suitable for use as the material of the heater 28. In addition, since the heater 28 is not a part of the second metal layer 24 and is a separate component, there is no need to consider the thermal matching with the second metal layer 24, the material selectivity is large, and the process layout is favorable. In some embodiments, the third metal layer 30 may include high-melting-point materials, such as molybdenum, titanium, metal oxides or a combination thereof, but the present disclosure is not limited thereto. In FIG. 2, the third metal layer 30 includes two bridging components (30a and 30b). The bridging component 30a is electrically connected to the drain 24b of the thin-film transistor (TFT) and the heater 28 respectively. The bridging component 30b is electrically connected the common voltage source and the heater 28 respectively. That is, a portion of the bridging component 30a is positioned over the drain 24b, and another portion of the bridging component 30a is positioned over the heater 28. The high-melting-point bridge material is used as the electrical connection between the thin-film transistor (TFT) and the heater 28, which can effectively maintain the reliability of the connection area between the thin-film transistor (TFT) and the heater 28. In another embodiment, the bridging component 30a is electrically connected to the source 24a of the thin-film transistor (TFT) and the heater 28 respectively.

From the point of view of the process, if the thin-film transistor (TFT) is directly connected to the heater 28, under the high-temperature process conditions, it is easy to cause the phenomenon of metal miscibility, which increases the impedance of the connection point between the thin-film transistor (TFT) and the heater 28, resulting in electrical instability. From the point of view of the product operation, since the heater 28 is used to generate heat and heat the ink droplets, the high-temperature state is maintained most of the time. If the source 24a or the drain 24b with low melting point is adjacent to the heater 28, the reliability of the product will be seriously affected. Therefore, the present disclosure uses the third metal layer 30a of high-melting-point material as the bridging component to electrically connect the drain 24b of the thin-film transistor (TFT) and the heater 28 respectively, which can not only stabilize the component impedance, but also maintain a certain level of reliability during the product operation.

Figure 3:
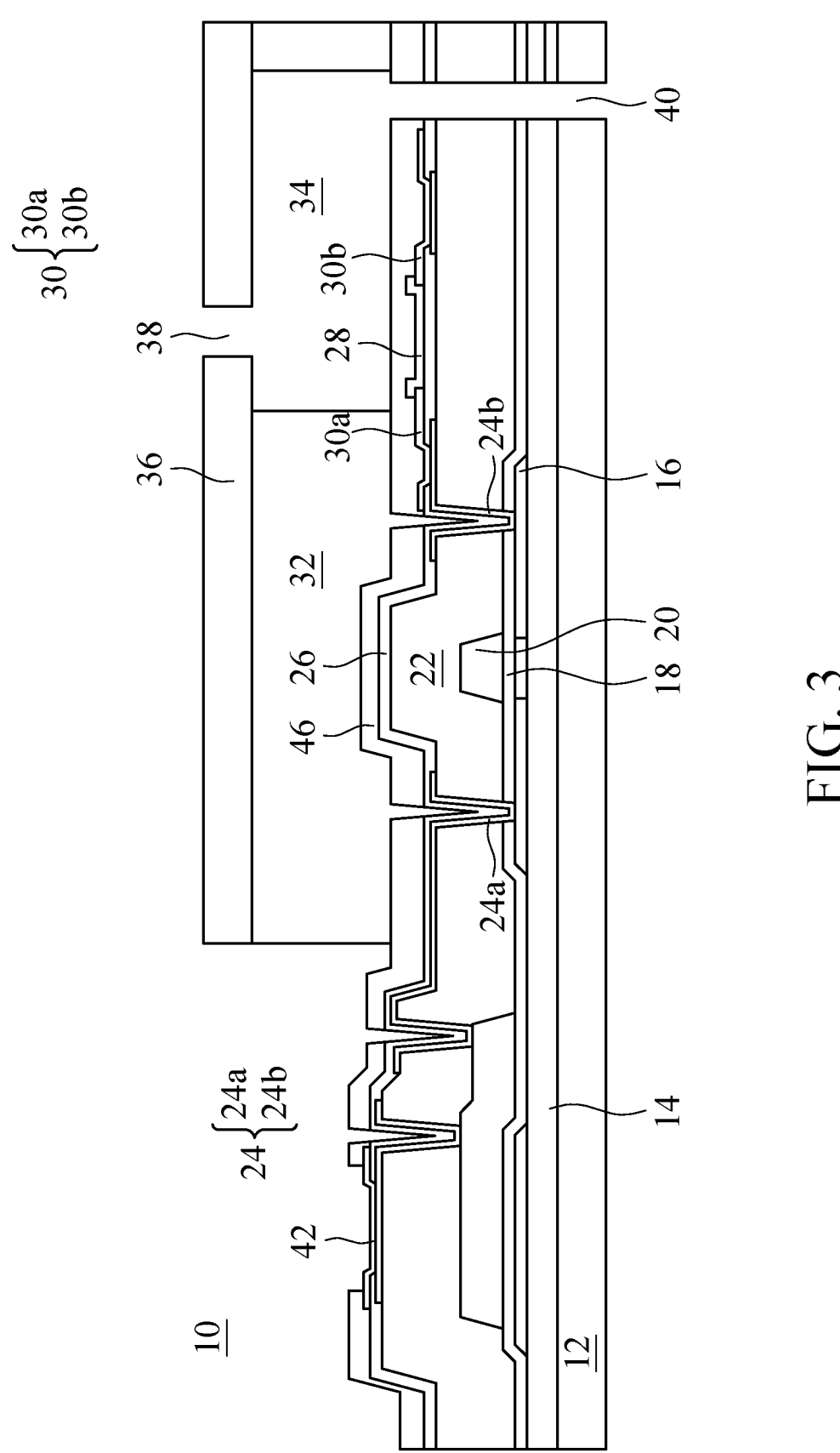
FIG. 3 shows a cross-sectional view of a heating device in accordance with one embodiment of the present disclosure.

Referring to FIG. 3, in accordance with one embodiment of the present disclosure, a heating device 10 is provided. FIG. 3 is a cross-sectional view of the heating device 10.

The embodiment of the heating device 10 disclosed in FIG. 3 is similar to the embodiment of the heating device 10 disclosed in FIG. 2, and the similarities will not be repeated. The main difference lies in the configuration of the bridging component (the third metal layer) 30a and the heater 28. In FIG. 3, a part of the bridging component 30a is disposed above the drain 24b, and another part of the bridging component 30a is disposed below the heater 28.

Figure 4:
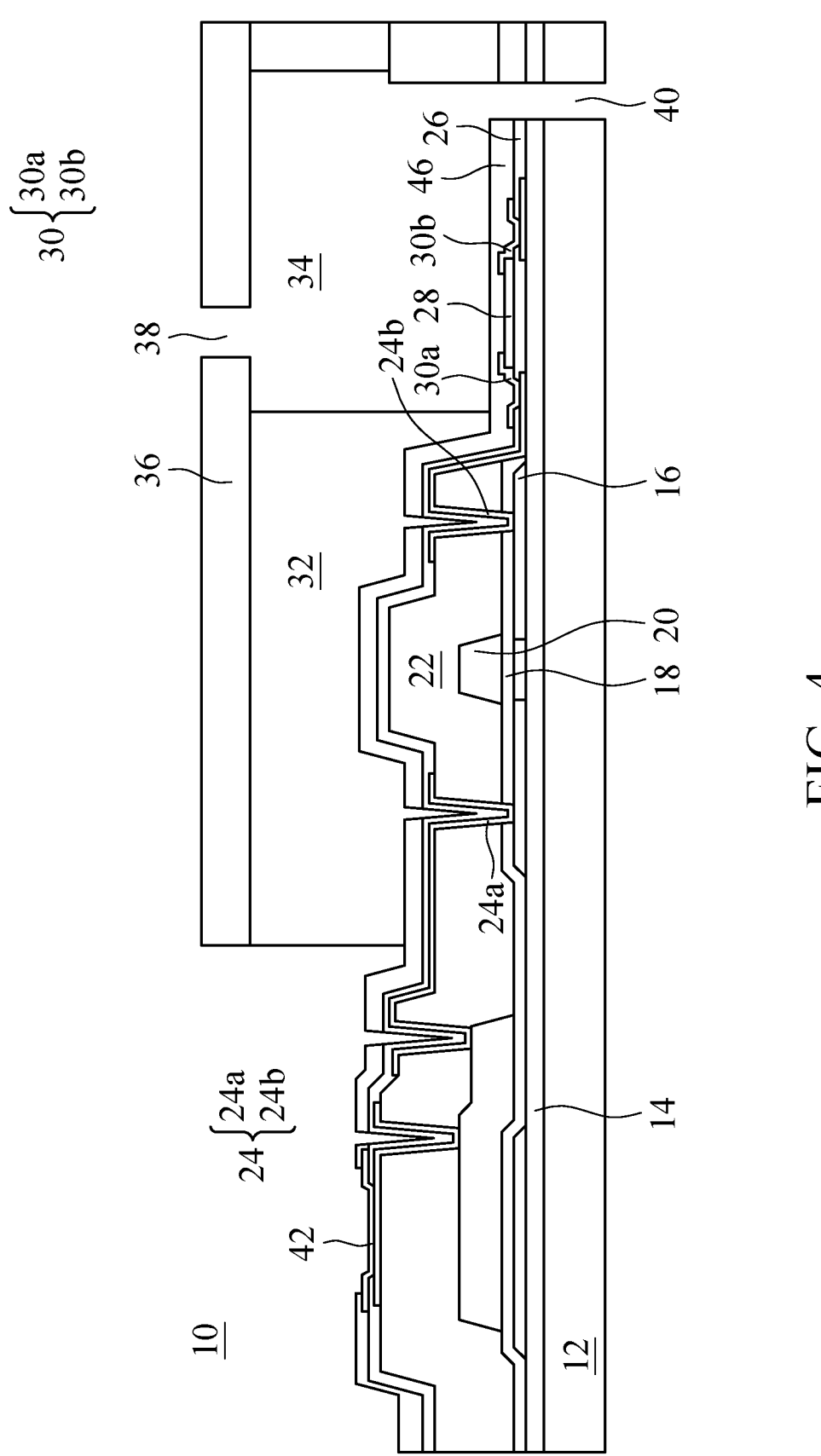
FIG. 4 shows a cross-sectional view of a heating device in accordance with one embodiment of the present disclosure.

Referring to FIG. 4, in accordance with one embodiment of the present disclosure, a heating device 10 is provided. FIG. 4 is a cross-sectional view of the heating device 10.

The embodiment of the heating device 10 disclosed in FIG. 4 is similar to the embodiment of the heating device 10 disclosed in FIG. 2, and the similarities will not be repeated. The main difference lies in the configuration of the heater 28. In FIG. 4, the first insulating layer 18 and the second insulating layer 22 each includes a hollow area (not shown) corresponding to the position of the heater 28, that is, the first insulating layer 18 and the second insulating layer 22 corresponding to the position of the heater 28 are removed, so that the third insulating layer 26 is disposed on the buffer layer 14. In this way, the heater 28 located on the third insulating layer 26 will also be disposed on the buffer layer 14 (that is, in the hollow area formed by the first insulating layer 18 and the second insulating layer 22), but not on the first insulating layer 18 and the second insulating layer 22. Since the first insulating layer 18 and the second insulating layer 22 corresponding to the position of the heater 28 are removed, the influence of thermal stress on the insulating layer originally located under the heater 28 is avoided.

Figure 5:
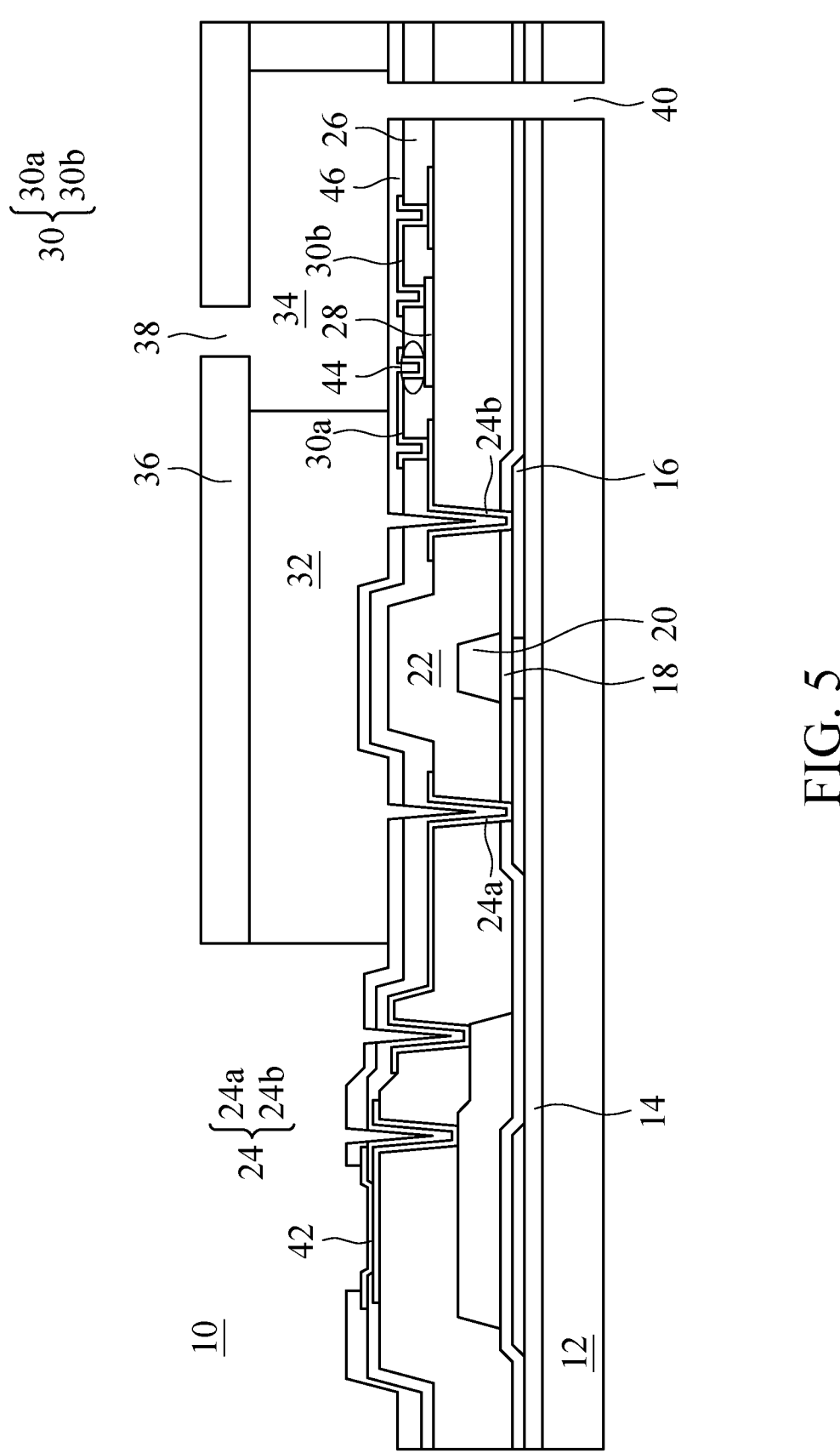
FIG. 5 shows a cross-sectional view of a heating device in accordance with one embodiment of the present disclosure.

Referring to FIG. 5, in accordance with one embodiment of the present disclosure, a heating device 10 is provided. FIG. 5 is a cross-sectional view of the heating device 10.

The embodiment of the heating device 10 disclosed in FIG. 5 is similar to the embodiment of the heating device 10 disclosed in FIG. 2, and the similarities will not be repeated. The main difference lies in the configuration of the bridging components (30a and 30b) and the heater 28. In FIG. 5, a part of the bridging components (30a and 30b) is electrically connected to the heater 28 through the contact hole 44 of the third insulating layer 26. The fourth insulating layer 46 is disposed on the third insulating layer 26 and covers the bridging components (30a and 30b).

Figure 6A:
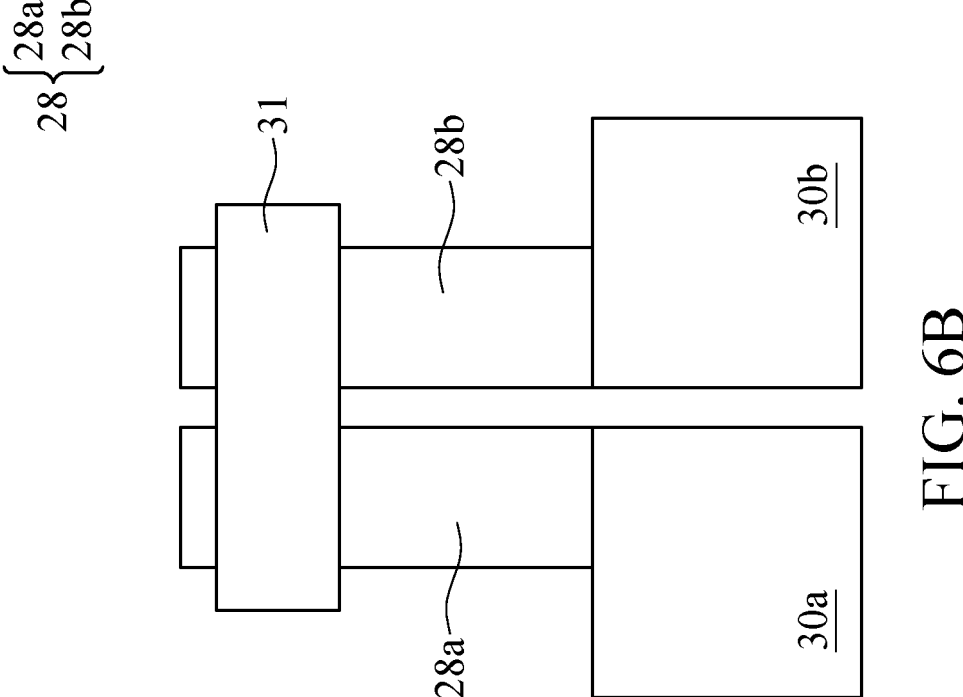
FIG. 6A shows a configuration of a heater and a bridging component in a heating device in accordance with one embodiment of the present disclosure.

Referring to FIG. 6A, in accordance with one embodiment of the present disclosure, a partial structure of a heating device is provided. FIG. 6A is a top view of the partial structure of the heating device, and the configuration of the heater 28, the bridging components (30a and 30b) and the connecting component 31 in the heating device is illustrated.

As shown in FIG. 6A, the heater 28 includes two heating parts (28a and 28b) that extend in the same direction, and a connecting component 31 electrically connected to the two heating parts (28a and 28b). In FIG. 6A, the connecting component 31 directly connects the two heating parts (28a and 28b), and the connecting component 31 almost overlaps the two heating parts (28a and 28b).

Figure 6B:
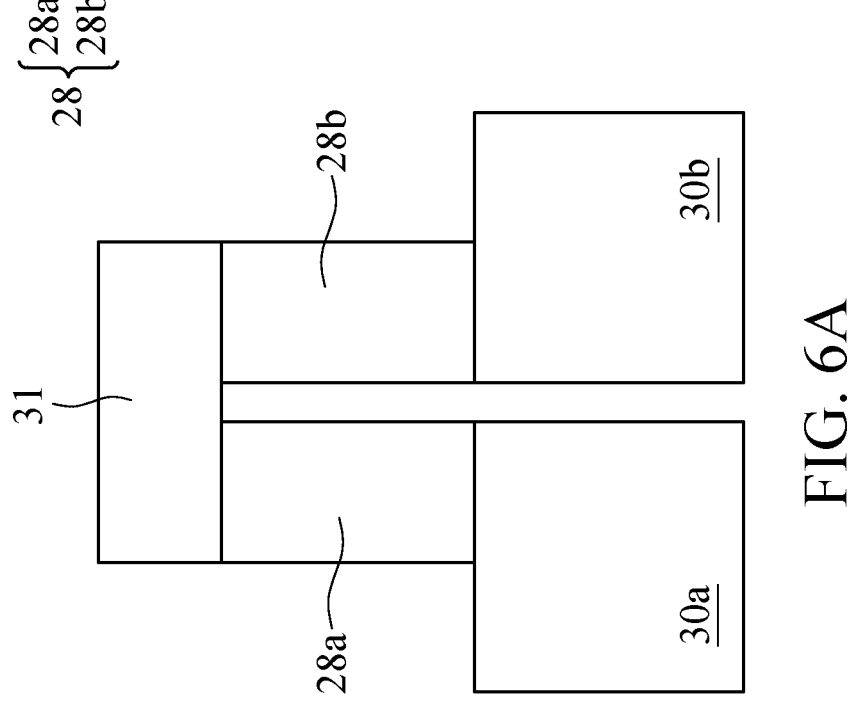
FIG. 6B shows a configuration of a heater and a bridging component in a heating device in accordance with one embodiment of the present disclosure.

Referring to FIG. 6B, in accordance with one embodiment of the present disclosure, a partial structure of a heating device is provided. FIG. 6B is a top view of the partial structure of the heating device, and the configuration of the heater 28, the bridging components (30a and 30b) and the connecting component 31 in the heating device is illustrated.

As shown in FIG. 6B, the heater 28 includes two heating parts (28a and 28b) that extend in the same direction, and a connecting component 31 electrically connected to the two heating parts (28a and 28b). In FIG. 6B, the connecting component 31 directly connects the two heating parts (28a and 28b), and the connecting component 31 includes a portion that does not overlap the two heating parts (28a and 28b). Based on this, even if there is a process deviation during the fabrication of the connecting component 31 and the two heating parts (28a and 28b), there is still a chance to maintain the contact area between the connecting component 31 and the two heating parts (28a and 28b) within a preset range, and maintain the stability of the contact resistance between the connecting component 31 and the two heating parts (28a and 28b).

Figures 7A, 7B:
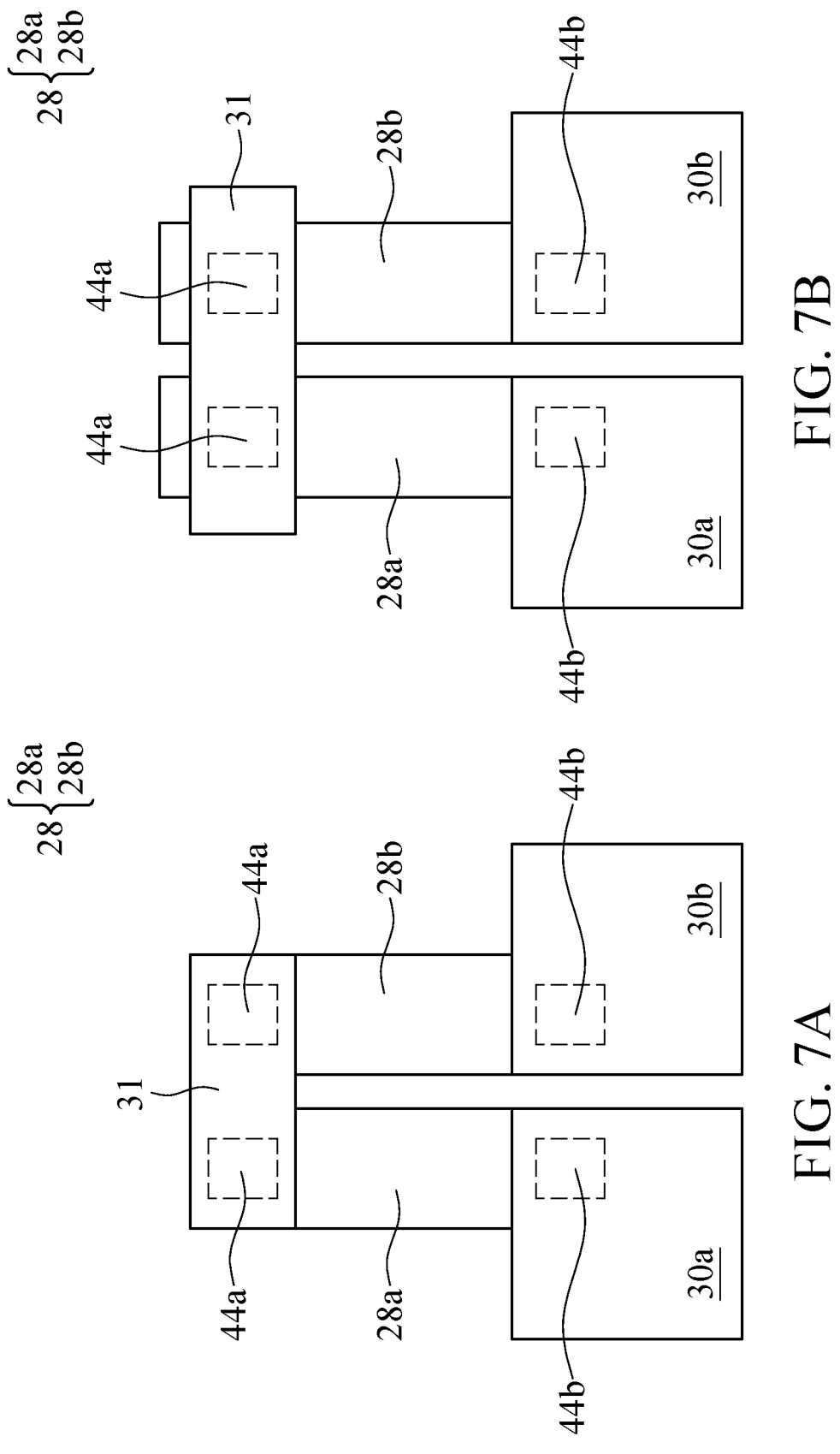
FIG. 7A shows a configuration of a heater and a bridging component in a heating device in accordance with one embodiment of the present disclosure.
FIG. 7B shows a configuration of a heater and a bridging component in a heating device in accordance with one embodiment of the present disclosure.

Referring to FIG. 7A, in accordance with one embodiment of the present disclosure, a partial structure of a heating device is provided. FIG. 7A is a top view of the partial structure of the heating device, and the configuration of the heater 28, the bridging components (30a and 30b) and the connecting component 31 in the heating device is illustrated.

As shown in FIG. 7A, the heater 28 includes two heating parts (28a and 28b) that extend in the same direction, and a connecting component 31 electrically connected to the two heating parts (28a and 28b). In FIG. 7A, the connecting component 31 and the bridging components (30a and 30b) are electrically connected to the two heating parts (28a and 28b) through the contact holes (44a and 44b) respectively, and the connecting component 31 almost overlaps the two heating parts (28a and 28b).

Referring to FIG. 7B, in accordance with one embodiment of the present disclosure, a partial structure of a heating device is provided. FIG. 7B is a top view of the partial structure of the heating device, and the configuration of the heater 28, the bridging components (30a and 30b) and the connecting component 31 in the heating device is illustrated.

As shown in FIG. 7B, the heater 28 includes two heating parts (28a and 28b) that extend in the same direction, and a connecting component 31 electrically connected to the two heating parts (28a and 28b). In FIG. 7B, the connecting component 31 and the bridging components (30a and 30b) are electrically connected to the two heating parts (28a and 28b) through the respective contact holes (44a and 44b), and the connecting component 31 includes a portion that does not overlap the two heating parts (28a and 28b).

In the embodiments shown in FIGS. 7A and 7B, since the connecting component 31 and the bridging components (30a and 30b) are electrically connected to the two heating parts (28a and 28b) through the contact holes (44a and 44b), the contact area of the connecting component 31 and the bridging components (30a and 30b) with the heating part (28a and 28b) can be controlled by the size of the contact hole, which can improve the problem of uneven contact area caused by process deviation, and maintain the stability of the contact resistance between the connecting component 31 and the two heating parts (28a and 28b).

According to the configuration of the heater 28 and the connecting component 31 shown in FIGS. 6A, 6B, 7A and 7B, either the connecting component 31 directly connects the heating parts (28a and 28b), or the connecting component 31 and the bridging components (30a and 30b) are electrically connected to the heating parts (28a and 28b) through the contact holes (44a and 44b), the contact area between the heater 28 and the connecting component 31 can be effectively maintained within a preset range, thereby maintaining the stability of the contact resistance between the heater 28 and the connecting component 31.

Referring to FIGS. 8A to 8I, in accordance with one embodiment of the present disclosure, a method for fabricating a heating device (as shown in FIG. 2) is provided. FIGS. 8A to 8I are cross-sectional views of the fabrication method.

Figure 8A:
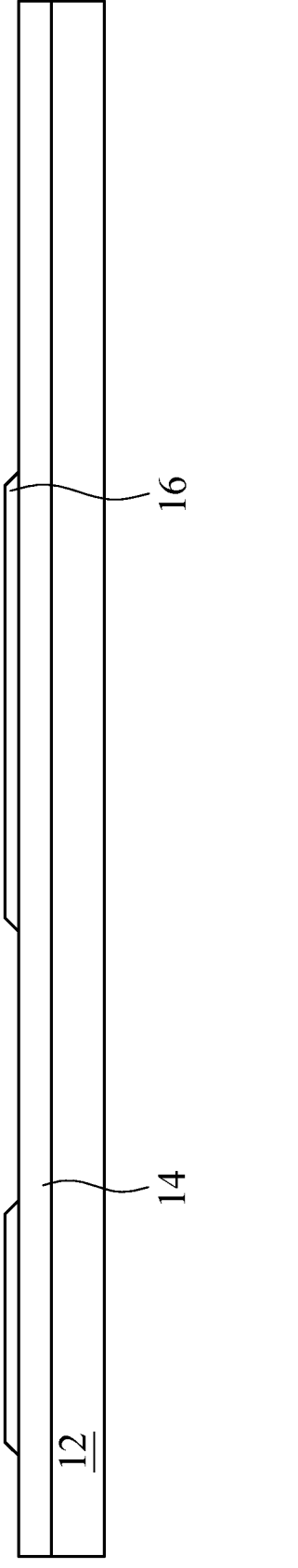
FIGS. 8A to 8I show cross-sectional views of a method for fabricating a heating device in accordance with one embodiment of the present disclosure.

As shown in FIG. 8A, a substrate 12 is provided on which a buffer layer 14 and a semiconductor layer 16 are sequentially formed.

Figure 8B:
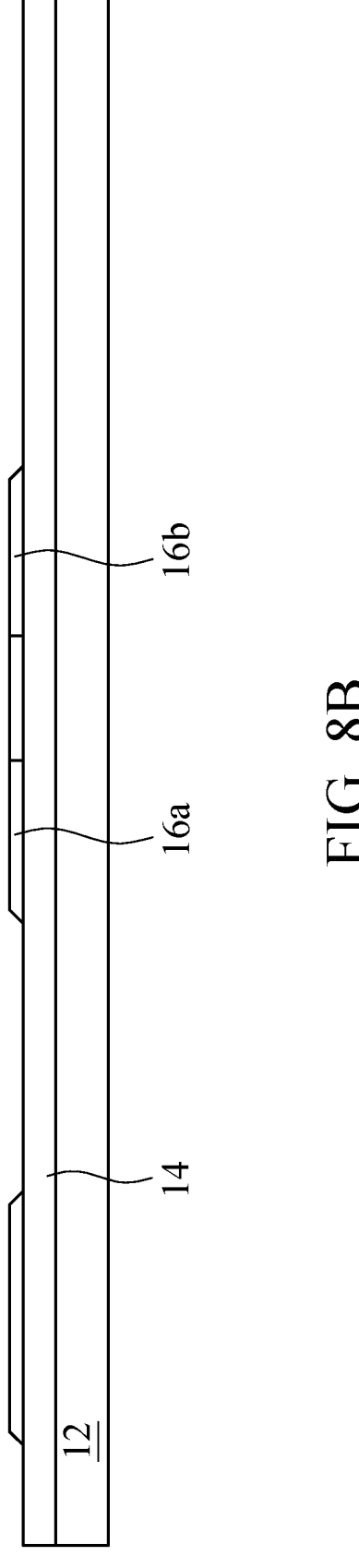

As shown in FIG. 8B, a doping process is performed on the semiconductor layer 16 to form a source region 16a and a drain region 16b.

Figure 8C:
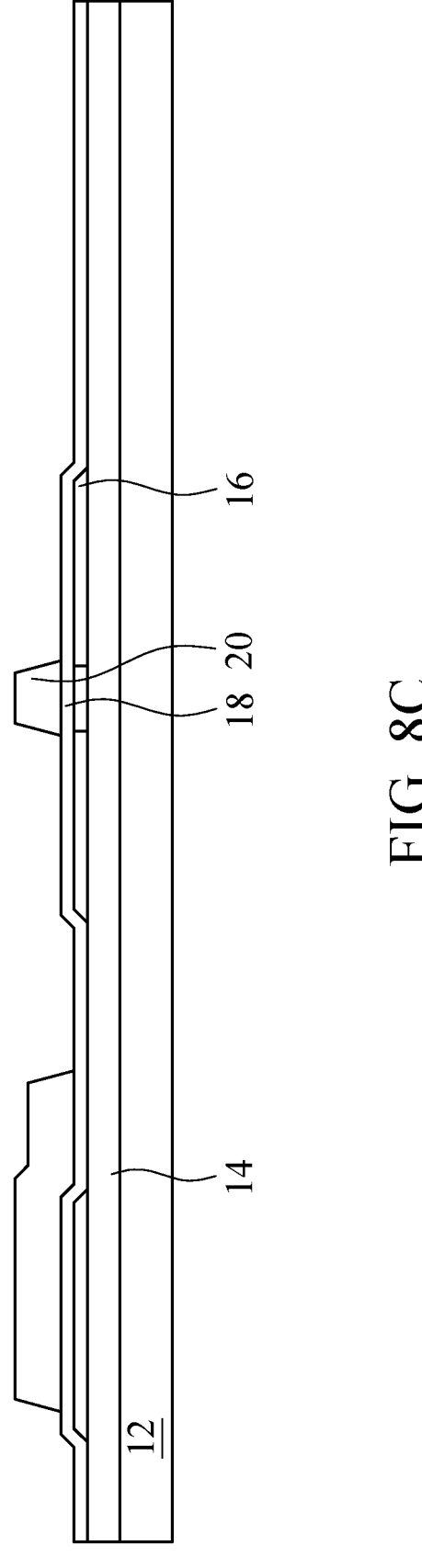

As shown in FIG. 8C, a first insulating layer 18 is formed on the buffer layer 14 and covers the semiconductor layer 16. Next, a first metal layer 20 (a gate) is formed on the first insulating layer 18.

Figure 8D:
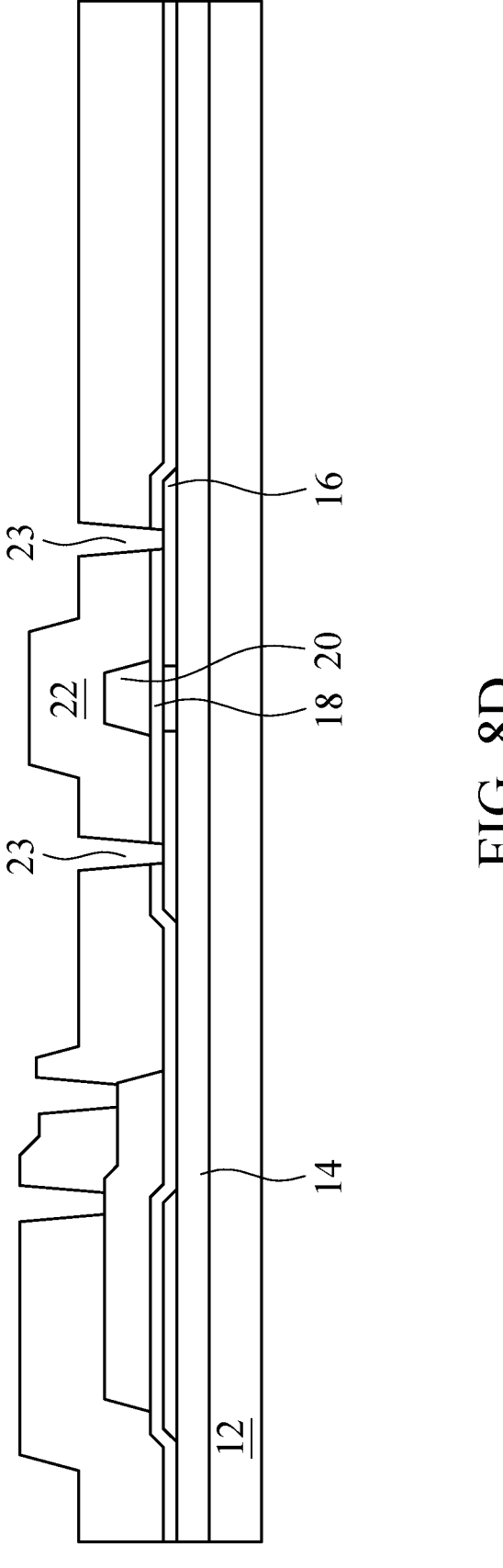

As shown in FIG. 8D, a second insulating layer 22 is formed on the first insulating layer 18 and covers the first metal layer 20. Next, an etching process is performed on the first insulating layer 18 and the second insulating layer 22 to form openings 23 to expose the semiconductor layer 16.

Figure 8E:
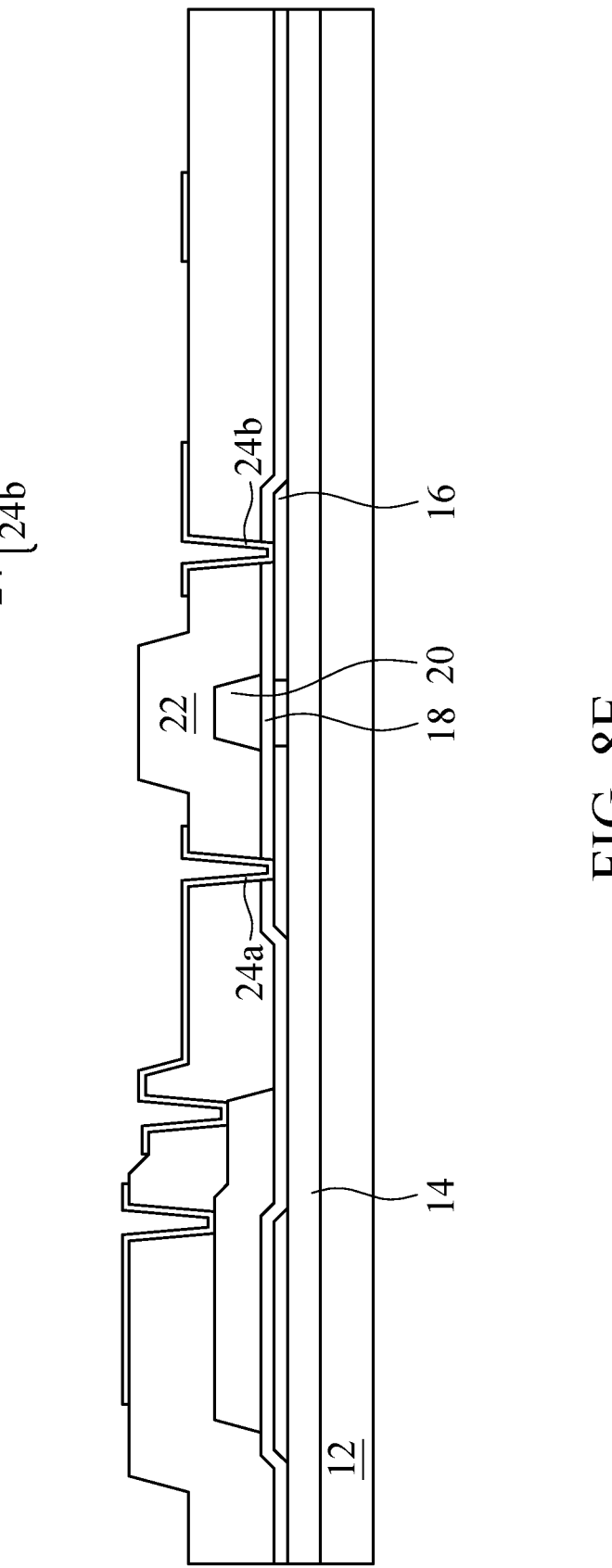

As shown in FIG. 8E, a second metal layer 24 is filled in the openings 23, electrically connected to the semiconductor layer 16, and extended on the second insulating layer 22. The second metal layer 24 forms a source 24a and a drain 24b on the both sides of the gate 20.

Figure 8F:
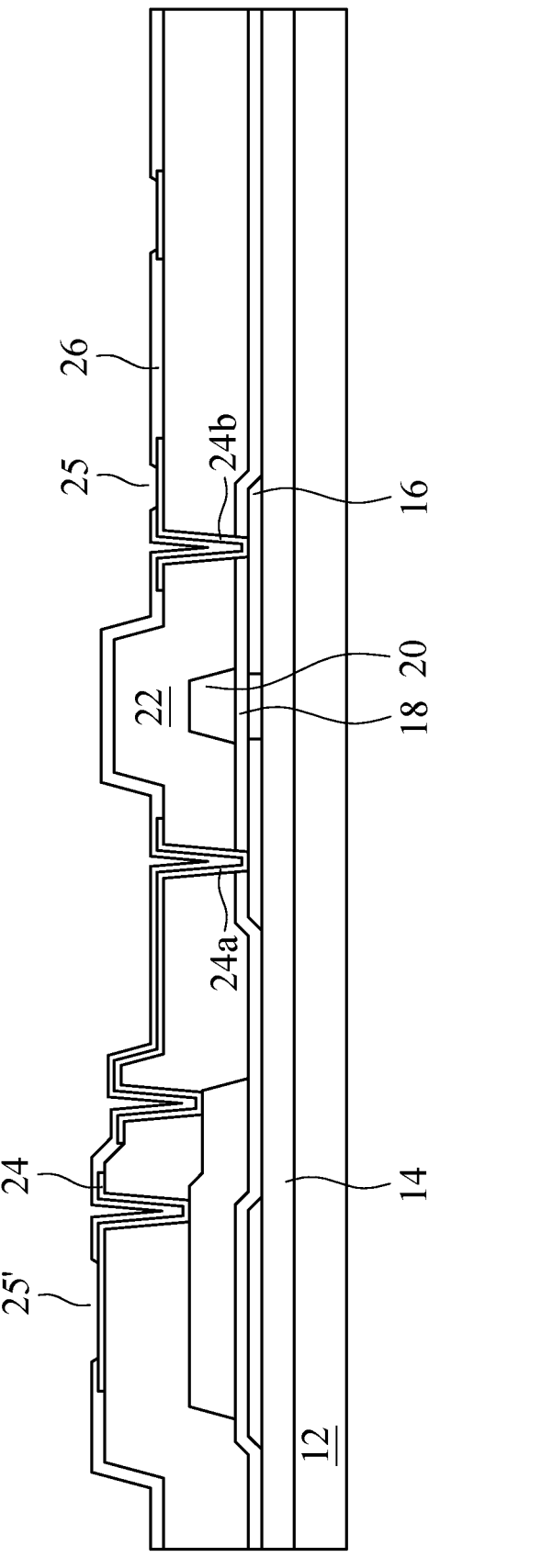

As shown in FIG. 8F, a third insulating layer 26 is formed on the second insulating layer 22 and covers the second metal layer 24. Next, an etching process is performed on the third insulating layer 26 to form openings (25 and 25'), respectively exposing the drain 24b and the second metal layer 24.

Figure 8G:
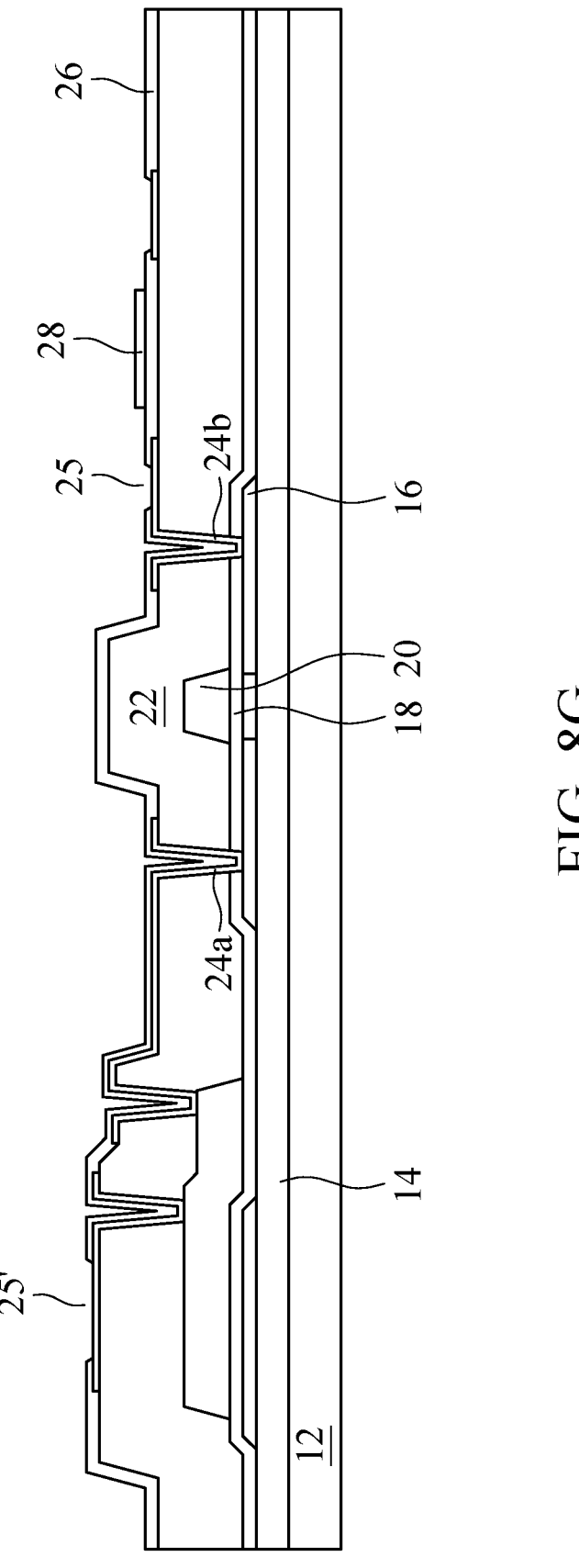

As shown in FIG. 8G, a heater 28 is formed on the third insulating layer 26 and located on the side of the drain 24b opposite to the gate 20. In some embodiments, the step of forming the heater 28 includes performing an annealing process on the heater 28.

Figure 8H:
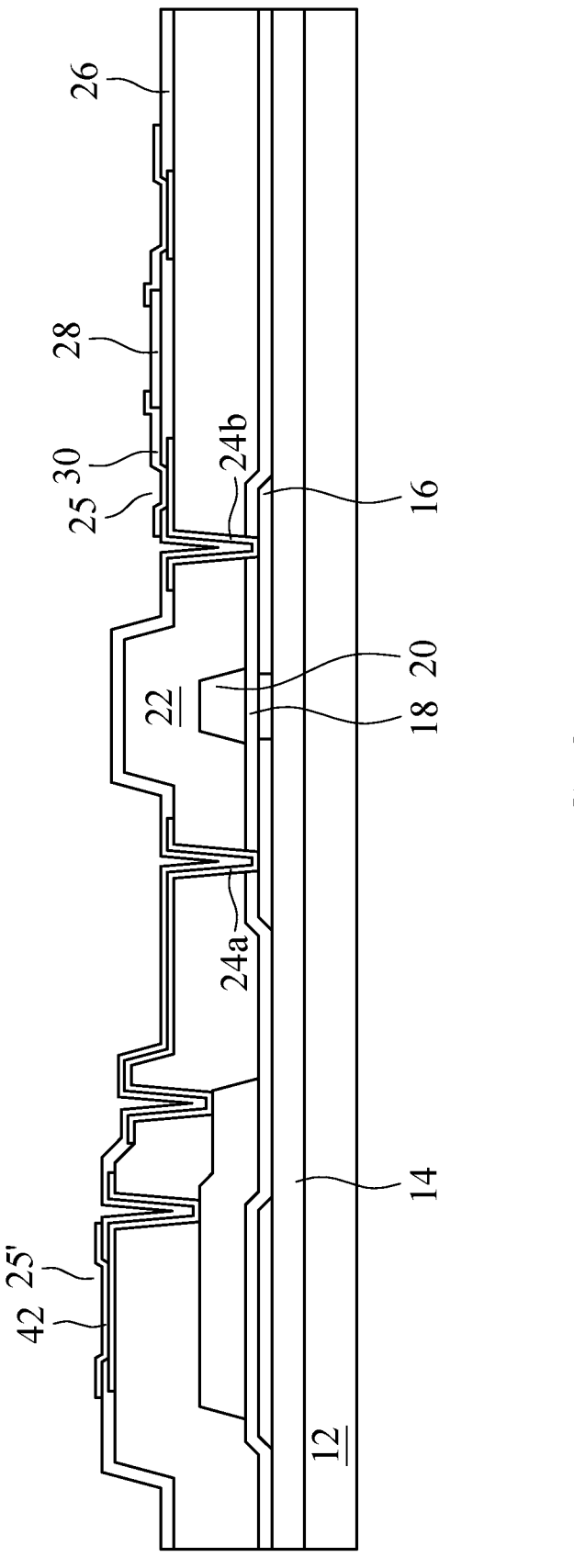

As shown in FIG. 8H, a third metal layer 30 is formed on the third insulating layer 26 and filled in the opening 25 to form an electrical connection with the drain 24b. The third metal layer 30 formed on the drain 24b is a bridging component, which electrically connects the heater 28 and the drain 24b respectively. At the same time, a bonding pad 42 is formed on the third insulating layer 26 and filled in the openings 25' to form an electrical connection with the second metal layer 24. In this embodiment, the step of forming the heater 28 is performed before the step of forming the bridging component 30.

Figure 8I:
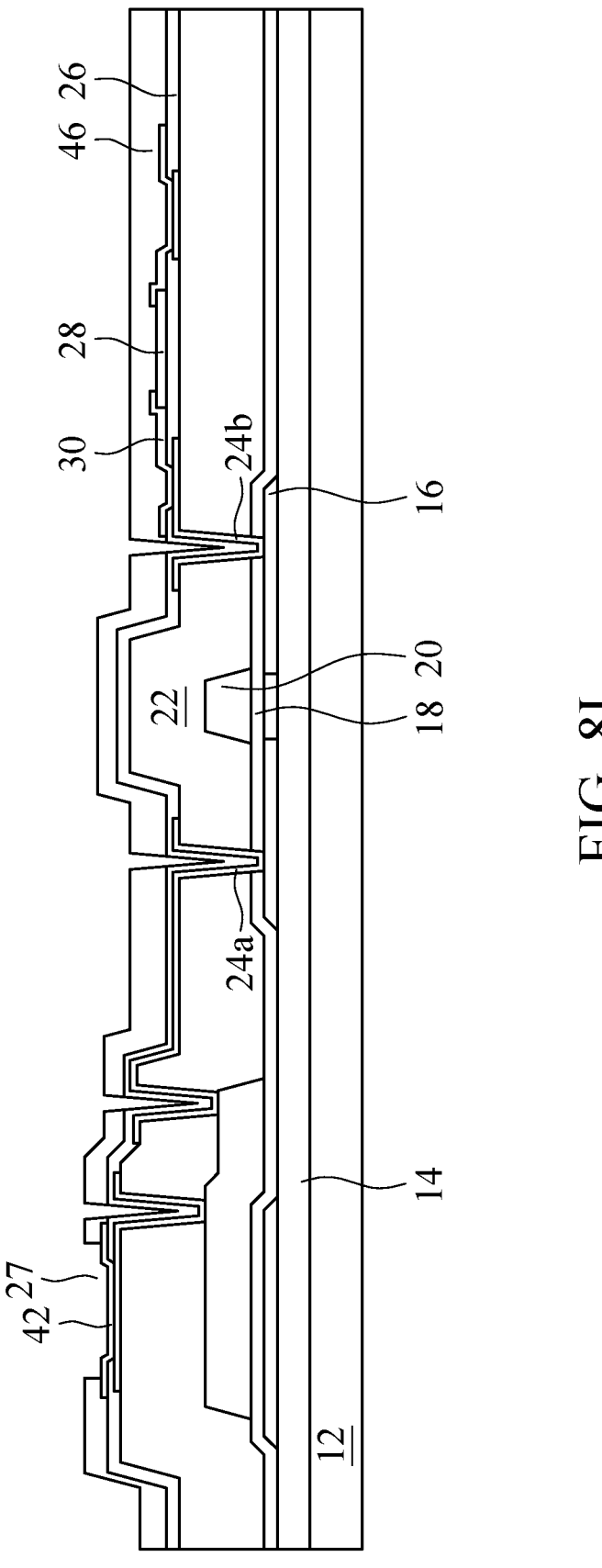

As shown in FIG. 8I, a fourth insulating layer 46 is formed on the third insulating layer 26 and covers the heater 28 and the third metal layer 30. Next, an etching process is performed on the fourth insulating layer 46 and the third insulating layer 26 to form an opening 27 and expose the bonding pad 42.

In addition, a method for fabricating an ink inlet 40 is further described. When the substrate 12 is a glass substrate, the ink inlet 40 can be fabricated by the sandblasting and perforation. When the substrate 12 is a polyimide (PI) substrate, the ink inlet 40 can be fabricated by the photolithography and etching process.

In accordance with one embodiment of the present disclosure, a method for fabricating a heating device (as shown in FIG. 3) is provided. The embodiment of the fabrication method of the heating device disclosed in FIG. 3 is similar to the embodiment of the fabrication method of the heating device disclosed in FIGS. 8A to 8I, and the similarities will not be repeated. The main difference is that the step of forming the heater 28 is performed after the step of forming the bridging component 30.

In accordance with one embodiment of the present disclosure, a method for fabricating a heating device (as shown in FIG. 4) is provided. The embodiment of the fabrication method of the heating device disclosed in FIG. 4 is similar to the embodiment of the fabrication method of the heating device disclosed in FIGS. 8A to 8I, and the similarities will not be repeated. The main difference is that a part of the first insulating layer 18 and the second insulating layer 22 is removed to form a hollow area, and the heater 28 is formed on the substrate 12 at the position corresponding to the hollow area.

In accordance with one embodiment of the present disclosure, a method for fabricating a heating device (as shown in FIG. 5) is provided. The embodiment of the fabrication method of the heating device disclosed in FIG. 5 is similar to the embodiment of the fabrication method of the heating device disclosed in FIGS. 8A to 8I, and the similarities will not be repeated. The main difference is that the step of forming the heater 28 is performed before the step of forming the source 24a and the drain 24b.

In accordance with one embodiment of the present disclosure, a method for fabricating a heating device (as shown in FIG. 5) is provided. The embodiment of the fabrication method of the heating device disclosed in FIG. 5 is similar to the embodiment of the fabrication method of the heating device disclosed in FIGS. 8A to 8I, and the similarities will not be repeated. The main difference is that, in the third insulating layer 26, a contact hole 44 is formed, allowing the bridging component 30 to be electrically connected to the heater 28 through the contact hole 44.

The glass substrate or polyimide (PI) substrate selected in the present disclosure can overcome the problem of size limitation of traditional silicon wafers when fabricating large-area inkjet heads. Using a TFT as a switching component has more advantages than using a MOSFET as a switching component in terms of number of masks and manufacturing cost. In addition, in the present disclosure, since the resistance-heater is not a part of the second metal layer, it is a separate component, there is no need to consider the thermal matching problem with the thin-film transistor (TFT), and the material selectivity is large, which is beneficial to the process layout. Furthermore, the present disclosure uses a high-melting-point bridge material as an electrical connection between the thin-film transistor (TFT) and the heater, which can effectively maintain the reliability of the connection area between the thin-film transistor (TFT) and the heater even under high-temperature process conditions. The above features make the present disclosure quite suitable for the fabrication of large-area inkjet heads.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A heating device, comprising:
a substrate;

10 a thin-film transistor disposed on the substrate, wherein the thin-film transistor comprises a gate, a semiconductor layer, a source and a drain;
a third insulating layer disposed on the substrate;
a heater disposed on the third insulating layer;
a fourth insulating layer disposed on the heater; and
a bridging component electrically connected to the heater and either the source or the drain, wherein the bridging component comprises molybdenum,
wherein the thickness of the fourth insulating layer corresponding to the heater is greater than the thickness of the third insulating layer corresponding to the heater.

2. The heating device as claimed in claim 1, further comprising a first insulating layer and a second insulating layer, wherein the first insulating layer is disposed between the semiconductor layer and the gate, the second insulating layer is disposed between the gate and the drain, and the first insulating layer and the second insulating layer each comprises a hollow area corresponding to a position of the heater.

3. The heating device as claimed in claim 1, wherein a first portion of the bridging component is disposed above the source or the drain, and a second portion of the bridging component is disposed above the heater.

4. The heating device as claimed in claim 3, wherein the third insulating layer is disposed above the drain, and the second portion of the bridging component is electrically connected to the heater through a first contact hole of the third insulating layer.

5. The heating device as claimed in claim 1, wherein a first portion of the bridging component is disposed above the source or the drain, and a second portion of the bridging component is disposed below the heater.

6. The heating device as claimed in claim 1, wherein a material of the heater comprises metals, metal alloys, metal oxides, or a combination thereof.

7. The heating device as claimed in claim 6, wherein the material of the heater comprises indium tin oxide (ITO).

8. The heating device as claimed in claim 1, further comprising a connecting component, wherein the heater comprises two heating parts extending in the same direction, and the connecting component is electrically connected to the two heating parts.

9. The heating device as claimed in claim 8, wherein the connecting component comprises a portion that does not overlap the two heating parts.

10. The heating device as claimed in claim 8, wherein the connecting component is electrically connected to the two heating parts through two respective contact holes of a third insulating layer.

* * * * *